United States Patent [19]

Sanders et al.

[11] Patent Number: 5,145,795
[45] Date of Patent: Sep. 8, 1992

[54] SEMICONDUCTOR DEVICE AND METHOD THEREFORE

[75] Inventors: Paul W. Sanders; Bernard W. Boland, both of Scottsdale, Ariz.

[73] Assignee: Motorola, Inc., Schaumburg, Ill.

[21] Appl. No.: 543,233

[22] Filed: Jun. 25, 1990

[51] Int. Cl.[5] .......................................... H01L 21/302
[52] U.S. Cl. ................................ 437/33; 437/62; 437/68; 437/974; 437/925; 148/DIG. 168
[58] Field of Search .................... 437/62, 67, 68, 33

[56] References Cited

U.S. PATENT DOCUMENTS

| | | | |
|---|---|---|---|
| 3,407,479 | 10/1968 | Fordemwalt et al. | 29/577 |
| 3,431,468 | 3/1969 | Huffman | 317/101 |
| 3,457,123 | 7/1969 | Van Pul | 148/1.5 |
| 3,461,003 | 8/1969 | Jackson, Jr. | 148/175 |
| 3,508,980 | 4/1970 | Jackson, Jr. et al. | 148/175 |
| 3,624,463 | 11/1971 | Davidsohn | 317/234 |
| 3,721,588 | 3/1973 | Hays | 148/175 |
| 3,738,877 | 6/1973 | Davidsohn | 148/175 |
| 3,755,012 | 8/1973 | George et al. | 148/175 |
| 3,783,044 | 1/1974 | Cheskis et al. | 148/175 |
| 3,797,102 | 3/1974 | Huffman | 29/577 |
| 3,800,195 | 3/1974 | Davidsohn | 317/235 |
| 3,832,247 | 8/1974 | Saddler et al. | 148/175 |
| 3,840,412 | 10/1974 | Davidsohn et al. | 148/187 |
| 3,902,936 | 9/1975 | Price | 156/3 |
| 3,929,528 | 12/1975 | Davidsohn et al. | 148/175 |
| 3,954,522 | 5/1976 | Roberson | 148/175 |
| 4,042,949 | 8/1977 | Davidsohn | 357/49 |
| 4,649,630 | 3/1987 | Boland et al. | 24/580 |
| 5,001,075 | 3/1991 | Boland et al. | 437/33 |

FOREIGN PATENT DOCUMENTS

| | | | |
|---|---|---|---|
| 52-30386 | 3/1977 | Japan | 437/33 |
| 0101437 | 6/1983 | Japan | 437/62 |
| 0186341 | 10/1984 | Japan | 437/62 |
| 0026837 | 2/1987 | Japan | 437/62 |

OTHER PUBLICATIONS

"VLSI Fabrication Principles", Sorab K. Ghandhi, 1983.

*Primary Examiner*—Olik Chaudhuri
*Assistant Examiner*—Long Pham
*Attorney, Agent, or Firm*—Joe E. Barbee; Robert M. Handy

[57] ABSTRACT

An improved high frequency dielectrically isolated (DIC) transistor (100) or integrated circuit is obtained by providing a highly doped single crystal semiconductor region (112) coupled to the device reference terminal (16') and extending between front (98) and rear (61) faces of the semiconductor die. This allows the reference terminal (16', 116) to be coupled to the package ground plane without use of wire bonds, thereby lowering the common mode impedance. The desired structure is formed in connection with DIC devices (100) by etching first (66) and second (77) nested cavities into a single crystal substrate (60). The cavities (66) form protruding islands (821, 822) of single crystal semiconductor having a height (80+68) about equal the final die thickness (110) and which, after conventional DIC processing using an oxide isolation layer (86) and a poly handle (88), are exposed by grinding away the poly handle (88) to expose the highly doped, single crystal reference terminal feed-through (112).

4 Claims, 4 Drawing Sheets

SEMICONDUCTOR DEVICE AND METHOD THEREFORE

FIELD OF THE INVENTION

This invention concerns improved means and methods for semiconductor devices and integrated circuits and, more particularly, devices and circuits employing dielectric isolation.

BACKGROUND OF THE INVENTION

The performance of high frequency transistors and integrated circuits depends upon the parasitic impedances associated with the device leads or terminals. For example, large amounts of parasitic capacitance associated with the input leads or output leads of amplifiers or other devices substantially degrades the upper cut-off frequency. Similarly, common mode impedance in the reference lead of a high frequency amplifying device provides negative feedback which can also adversely effect high frequency performance.

Numerous attempts have been made in the prior art to reduce such parasitic reactances in order to obtain the maximum performance from high frequency device or integrated circuits. For example, dielectric isolation is used to reduce parasitic capacitance and multiple wire bonds are employed in order to reduce parasitic inductance. Despite these and other techniques, however, the performance of present day high frequency transistors and integrated circuits is less than desired. Accordingly there continues to be a need for improving the performance of high frequency semiconductor devices and integrated circuits.

SUMMARY OF THE INVENTION

It is an object of the present invention to provide improved means and method for semiconductor devices and integrated circuits whereby parasitic reactances which otherwise adversely affect high frequency performance are reduced. It is a further object of the present invention to provide an improved means and method whereby the common mode impedance normally associated with wire bonds connecting the reference terminal of the semiconductor device to the ground plane or ground terminal of the device package is reduced. It is a still further object of the present invention to provide this reduction in common mode impedance as an integral part of the semiconductor die.

The foregoing and other objects and advantages are provided by a device structure having opposed principal surfaces and first and second spaced apart single crystal semiconductor regions of a first conductivity type. The first single crystal region extends to a first principal surface of the device and the second single crystal region extends between the first and second principal surfaces of the device.

An insulating region is provided in contact with the second single crystal region and extending from the first single crystal region to the second principal surface. The insulating region desirable comprises a dielectric layer adjacent the first and second single crystal regions and a polycrystalline semiconductor region extending from the dielectric layer to the second principal surface. The first and second single crystal semiconductor regions desirably have epitaxial layers adjacent their outward surfaces. A transistor or other active element is desirably formed in the epitaxial portion of the first single crystal region. Where the active element in the first single crystal region is a bipolar transistor and a grounded emitter configuration is desired, the emitter region is coupled by a metallization to the second single crystal region which forms an electrical feedthrough of high conductivity extending from the upper to the lower surface or the structure. The lower surface is desirably bonded directly to the package ground plane or heat sink. This provides the common connection for a grounded emitter amplifier.

The foregoing device structure is obtained by a method comprising, providing a single crystal substrate having first and second opposed principal surfaces, forming nested cavities in the first surface, a first cavity adjacent a first portion of the first surface and a second cavity at least partly within the first cavity. An insulating support is then formed which has an exposed first surface and a second surface in contact with the first portion of the first surface of the substrate and the exposed portions of the nested cavities. The second surface of the single crystal substrate is then lapped and/or polished until a portion of the insulating support located in a bottom of the second cavity is exposed.

An epitaxial layer is desirably formed on the lapped and/or polished second surface of the substrate and the desired semiconductor active element formed in the portion of the epitaxial layer lying adjacent to what was the bottom of the first cavity. After the semiconductor device or devices have been formed, desirably including a metallization which extends from the reference terminal of the device to an adjacent portion of the original substrate located alongside or around the original cavity, the backside of the insulating support is lapped and/or polished to reexpose the first portion of the first surface of the substrate adjacent to or surrounding the first cavity.

It is desirable that the starting substrate be highly doped at least in the portion that is left after cavity etching and back-lapping since this minimizes the impedance of the feedthrough which is formed from that portion of the substrate lying adjacent to or surrounding the first cavity. The insulating substrate desirably comprises a dielectric layer which is placed on the exposed and etched surfaces of the substrate after formation of the first and second nested cavities. The dielectric layer is followed by a thick polycrystalline handle which provides sufficient mechanical strength so that the bulk of the original single crystal substrate can be lapped and/or polished away.

As used herein, the words "lapped" and/or "polished" are intended to refer to any method for removing the semiconductor substrate or insulating support, including but not limited to, grinding, lapping, polishing, machining, abraiding, etching, and/or combinations thereof.

DETAILED DESCRIPTION OF THE FIGURES

Figures 1A, 1B, 2, 3, 4:
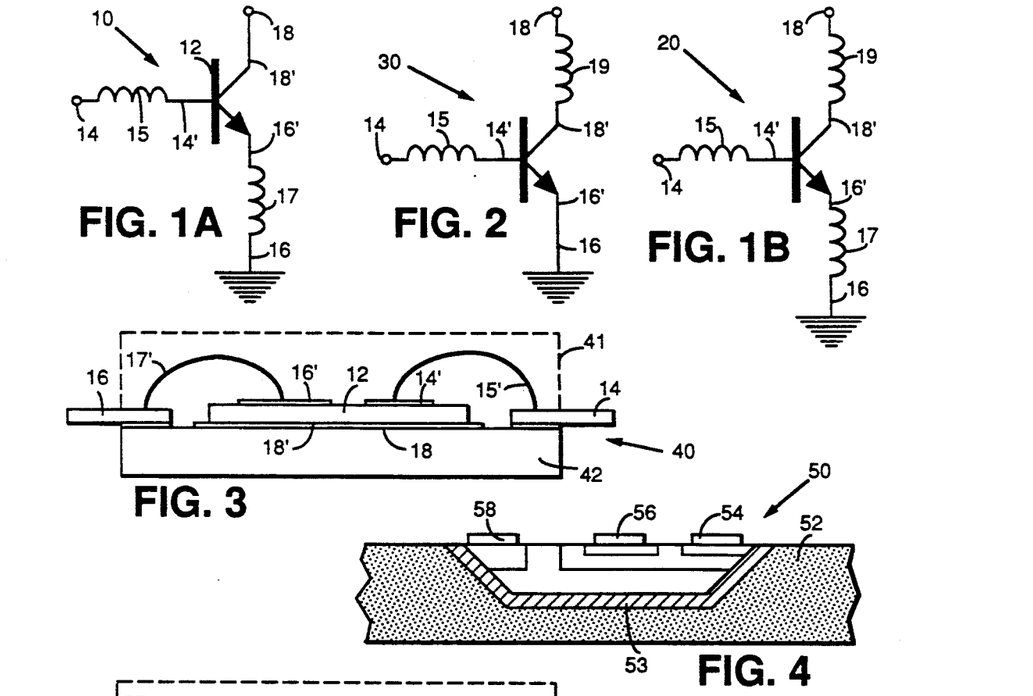
FIGS. 1A-1B and 2 are simplified schematic drawings of an amplifying transistor showing various parasitic impedances associated with its leads.
FIGS. 3 and 5 are simplified side views of high frequency amplifying transistor die mounted on supporting substrates and having the output connections of the die coupled to the external leads.
FIG. 4 is a highly simplified cross sectional view of a portion of a dielectrically isolated high frequency transistor.

FIG. 1A is a simplified schematic diagram of amplifying device 10 comprising, for example, bipolar transistor 12, and having input terminal 14, 14' with parasitic impedance 15, common terminal 16, 16' with parasitic impedance 17 and output terminal 18. FIG. 1B shows schematic diagram 20 similar to that in FIG. 1A but showing additional parasitic impedance 19 associated with output terminal 18, 18'. Such parasitic impedances typically arise from wire-bond inductance.

FIG. 2 shows simplified schematic 30 similar to that shown in FIGS. 1A–1B but where parasitic impedance 17 has been substantially eliminated from common lead 16, 16'. The substantial elimination of common mode parasitic impedance 17 shown in FIGS. 1A–B is a particular feature of the present invention.

FIG. 3 shows a simplified side view of semiconductor device 40 in which bipolar transistor 12 is mounted by collector metallization 18' to base 42. Transistor input bonding pad 14' is connected by wire bond 15' to device input terminal 14. Transistor reference terminal 16' is connected by wire bond 17' to device common terminal 16. Wire bonds 15' 17', give rise to parasitic impedances 15, 17 of FIGS. aA–1B.

FIG. 4 illustrates in cross-section dielectricaly isolated transistor 50 comprising polycrystalline substrate 52, oxide isolation 53, base input connection 54, emitter input connection 56, and collector connection 58. When device 50 is substituted for device 12 in FIG. 3, one obtains the arrangement shown in FIG. 5. Base connection 54 is connected by a wire bond 55 to input terminal 14, emitter connection 56 is coupled via wire bond 57 to device reference terminal 16, and collector connection 58 is coupled via wire bond 59 to collector output connection 18. Wire bonds 55, 57, 59 correspond to parasitic impedances 15, 17, 19, of FIG. 1B. Thus, while use of dielectrically isolated devices may reduce shunt capacitance across the various terminals of the amplifying device or transistor, additional wire bonds are now required which contribute additional parasitic inductance. Further, common mode parasitic impedance 17, 57 is not eliminated.

FIGS. 6–14 show, at different stages of fabrication, a method and structure for a dielectrically isolated transistor or integrated circuit in which the need for a wire bond 17', 57 and wire bonds impedance 17 is eliminated, thereby providing the more optimized circuit shown in FIG. 2. FIGS. 6–14 illustrate how two bipolar transistors are formed at the same time so that persons of skill in the art may understand that both individual devices and multiple devices interconnected to form a variety of circuits may be fabricated by the same process.

The description which follows describes various regions of particular conductivity types and conductivities and particular semiconductor materials and devices. However, those of skill in the art will understand that this is merely for convenience of explanation and not intended to be limiting.

Figure 6:
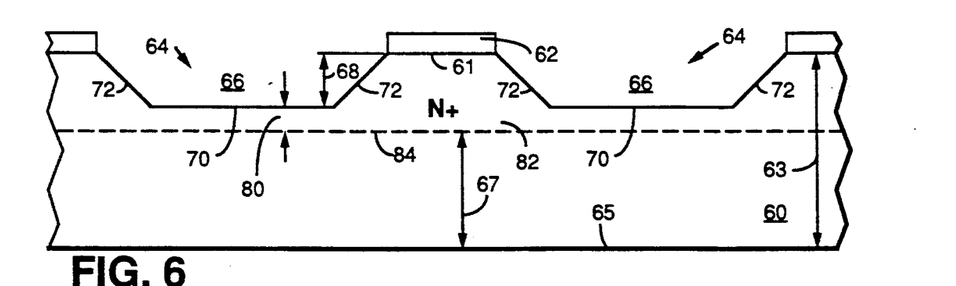
FIGS. 6–14 show simplified cross-sectional views of dielectrically isolated transistors at different stages of manufacture and according to preferred embodiments of the present invention.

Referring now to FIG. 6, single crystal semiconductor substrate 60 (e.g. silicon, germanium, III-V's, etc.) having surface 61 and initial thickness 63 (e.g., about 200 to 1000 micrometers, preferably about 500 micrometers thick) is covered by masking layer 62 having therein openings 64. The portion of substrate 60 between dashed line 84 and surface 61 (i.e., the sum of distances 80 plus 68) is preferably, uniformly doped and highly conductive (e.g. N+) and of <100> orientation. This is conveniently accomplished by using a starting substrate which is uniformly and highly doped and of <100> orientation throughout but that is not essential. Other doping levels and orientations may also be used. The portion of substrate 60 between dashed line 84 and substrate backside 65 (i.e., thickness 67) may be of any doping or even of another material since it will later be removed.

Cavities 66 are formed which have bottoms 70 spaced distance 68 away from surface 61. Sidewalls 72 connect bottoms 70 to surface 61 of substrate 60. For convenience of description, cavities 66 are referred to herein as the "first" cavities. Cavities 66 are typically about 150 to 200 micrometers, preferably about 175 micrometers deep. Following the step represented in FIG. 6, substrate 60 and cavities 66 are coated with second masking layer 74 having openings 76 therein. Openings 76 are generally located within openings 64 of initial mask 62, and preferably on bottoms 70 of cavities 66. Second cavities 77 are formed at least partially in bottoms 70 of first cavities 66 in substrate 60. Bottoms 78 of second cavities 77 lie at distance 80 below bottoms 70 of first cavities 66. It is generally desirable that depth 80 of second cavities 77 be less than depth 68 of first cavities 66. Cavities 77 are typically about 10 to 100 micrometers deep, preferably about 50 micrometers deep. Means and methods for forming cavities in semiconductor substrates are well known in the art. Orientation selective etching is preferred.

Figure 7:
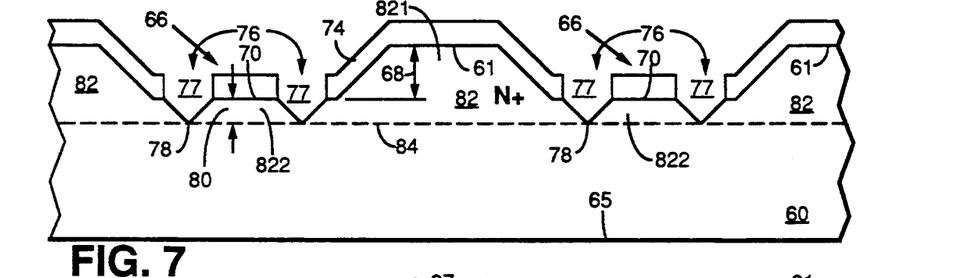
Figure 8:
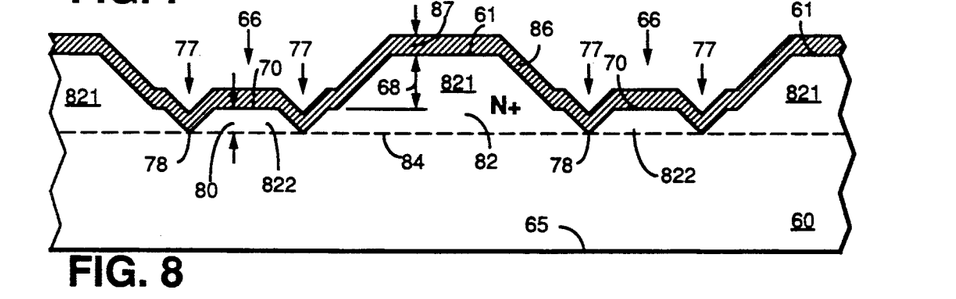

While the structure shown in FIGS. 7–8 has been described as being obtained by first forming cavities 66 and then forming cavities 77, which method is preferred, those of skill in the art will appreciate that a similar result, i.e., a similar nested cavity profile, is obtained by etching the cavities in reverse order. That is, mask 74 is applied to unetched surface 61 and cavities 77 are etched to a depth below surface 61 about equal to the amount by which depth 80 extends below surface 70. Then, mask 62 is applied and larger cavities 66 are etched. During the etching of larger cavities 66, smaller cavities 77 which lie within openings 64 and which are not masked continue to etch deeper into substrate 60 so that the final result has a profile about like that shown in FIGS. 7–8. Those of skill in the art will understand how to vary the openings in masks 74 and 62 and the etch conditions so as to obtain the desired final nested cavity profile, such as is shown for example in FIG. 8, depending upon which set of cavities is etched first.

As a consequence of etching nested cavities 66 and 77, unetched regions 82 of original substrate 60 adjacent cavities 66, 77 and extending between dashed line 84 and original upper surface 61 or cavity bottoms 70, are left in place. Dashed line 84 corresponds approximately to the bottoms 78 of cavities 77.

Referring now to FIG. 8, dielectric layer 86 is provided over the remaining portions of original surface 61 as well as the surfaces of cavities 66, 77. Dielectric layer 86 is conveniently silicon dioxide or silicon nitride or glass or a combination thereof. Layer 86 is conveniently about 0.5 to 5 micrometers thick, preferably about one micrometer thick. Means and method for forming such layers are well known in the art.

Undisturbed region 82 of substrate 60 lying between dashed line 84 and either surface 61 or bottom 70 of substrate 60 is composed of two portions: first portion 821 lying between dashed line 84 and original substrate surface 61 and second portion 822 lying between dashed line 84 and bottom 70 of first cavities 66.

Figure 9:
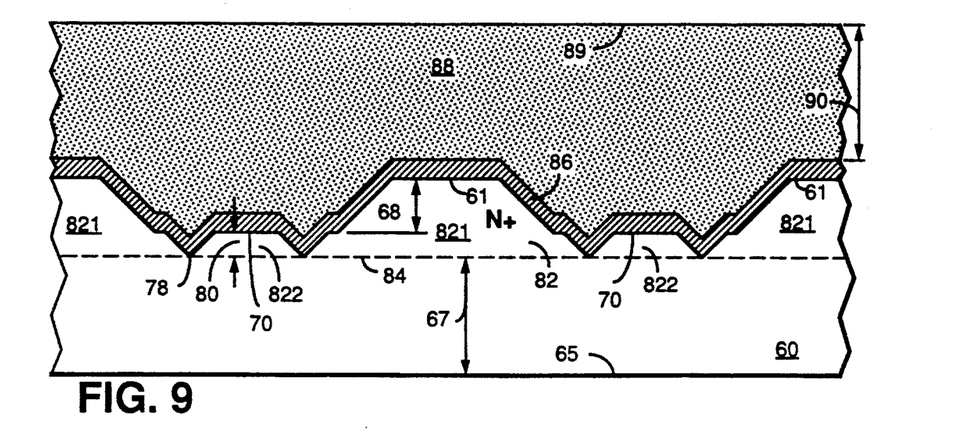

Referring now to FIG. 9, dielectric layer 86 is desirably covered by a further dielectric or high resistance layer 88 of about 750 to 1250 micrometers thickness, preferably about 1000 micrometers thickness. Because of the presence of cavities 66, 77, the initial outer surface of layer 88 tends to be uneven and it is desirable to lap the outer surface so that planarized surface 89 of layer 88 is flat and parallel to substrate surface 65 before proceeding with further processing. This is readily accomplished using means well known in the art. Thickness 90 of layer 88 after planarization is desirably about 200-400 micrometers, preferably about 275 micrometers so that the sum of thicknesses 68, 80 and 90 is about 400-600 micrometers, preferably about 500 micrometers.

Polycrystalline silicon is conveniently used for thick layer 88. Layer 88 is referred to in the art as a "handle" since its function is to provide mechanical strength during subsequent process steps Polysilicon 88 is desirably semi-insulating, e.g. un-doped. For convenience of identification polycrystalline region 88 and other polycrystalline regions formed in the devices are shown stippled in FIGS. 9-14.

Those of skill in the art will understand how to provide masking layers 62, 74 and how to etch cavities 66 and 77 in the configuration illustrated in applicants FIGS. 6-7. Further, those of skill in the art will understand how to form dielectric layers 86 and further insulating layer 88. Techniques for providing cavities in single crystal semiconductor substrates, as for example silicon, germanium, and III-V's are well known in the art. Techniques for depositing silicon oxide, nitride, glasses or mixtures thereof are also well known in the art. Techniques for depositing polycrystalline silicon on semiconductor substrates are also well known to those of skill in the art.

In keeping with the convention in the art, the vertical orientation of FIGS. 10-14 has been flipped with respect to the vertical orientation of FIGS. 6-9. This is because, during the early days of DIC fabrication technology, surface 61 of substrate 60 normally faced upward during steps 6 through 9 and normally faced downward during steps 10 through 14.

Figure 10:
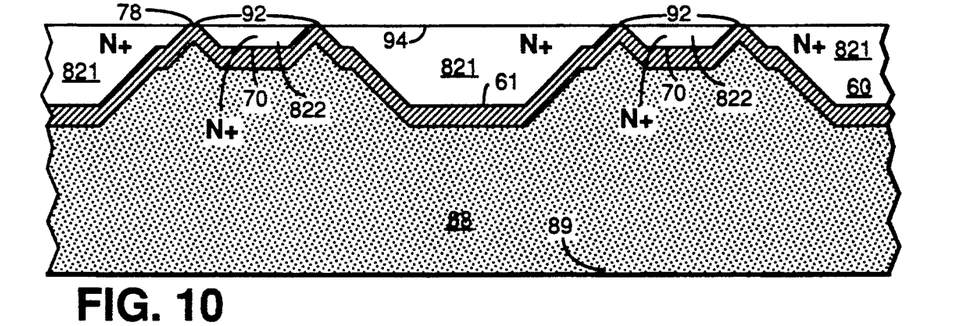

Referring now to FIGS. 9-10, single crystal substrate 60 is lapped and/or polished from rear surface 65 (See FIG. 9) to produce the structure shown in FIG. 10. Thickness 67 of substrate 60 extending approximately from rear face 65 to dashed line 84 is removed (e.g. about 250-350 micrometers, typically about 275-300 micrometers of material). This is preferably accomplished using a combination of mechanical lapping and chemical polishing well known in the art of producing dielectrically isolated circuits (DIC) or devices. This backlapping process is referred to in the art as "shaping out". The shaping out process is continued generally until portions 92 of dielectric layer lying at or near bottoms 78 of cavities 77 between single crystal region 821 and 822 are exposed. This provides newly exposed substrate surface 94.

Figure 11:
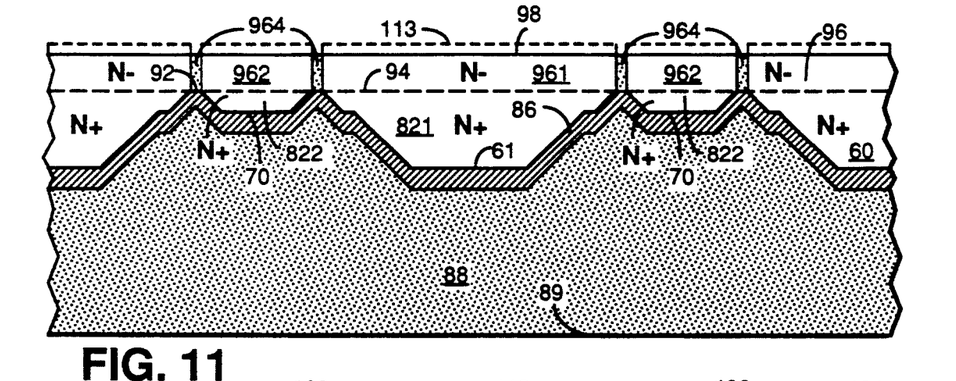

The exact stopping place of the shaping-out process is not critical and lapping and/or polishing of substrate 60 from back-side 65 can continue beyond dashed line 84 into dielectric 86 and underlying handle 88 in cavities 77 so 10 long as it does not reach surface 70. Some of single crystal region 822 needs to be left as an active device region or as a seed for subsequent epitaxial growth of an active device region. It is also desirable that some minimum thickness of region 82 be left to act as a low resistance buried collector contact where a bipolar transistor is to be constructed above region 822 (e.g., see FIG. 12). Those of skill in the art will understand how to determine the minimum thickness of single crystal semiconductor material that should be left in region 822 depending upon the conductivity of the starting material and the desired device properties and, thus, how far back-side lapping and/or polishing of substrate 60 should continue. Referring now to FIG. 11, lightly doped (e.g. N−) epitaxial layer 96 is desirably provided on surface 94. Epitaxial layer 96 comprises single crystal region 961 which forms over substrate region 821, single crystal region 962 which forms over substrate region 822 and polyregion 964 which forms over exposed portion 92 of dielectric layer 86 (or underlying handle 88 if any portion thereof has been exposed in these locations during shaping-out). For convenience of identification poly regions 964 are shown stippled.

During epitaxial deposition, regions 961, 962 have the same single crystal structure as underlying regions 821, 822, while portions 964 generally are polycrystalline as a result of being grown on top dielectric portions 92 of layer 86. Epitaxial layer 96 is desirably very lightly doped when, as in this example, is it intended to be used as the collector region of a bipolar transistor or the substrate for a MOSFET. Epitaxial layer 96 has surface 98.

Figure 12:
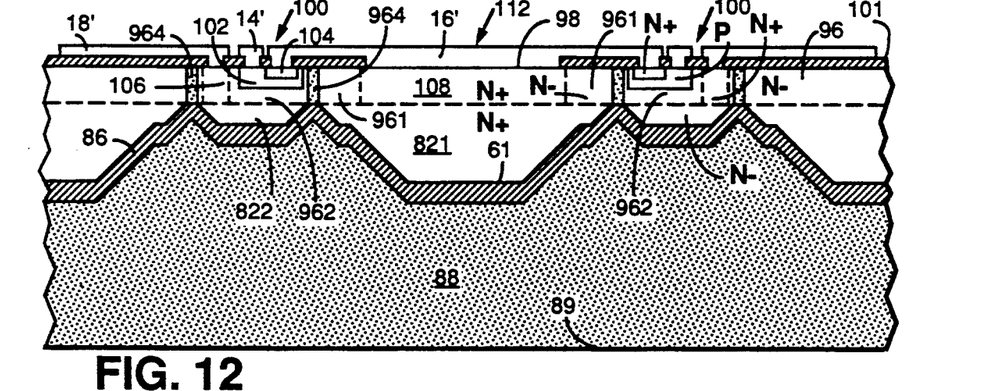

Referring now to FIG. 12, bipolar transistor 100 is formed in epitaxial region 962 above single crystal substrate region 822. Single crystal substrate region 822 serves as a buried collector contact. Lightly doped (e.g. N−) region 962 serves as the collector region. Base region 102 (e.g P+) is provided in collector region 962 and emitter region 104 (e.g. N+) is provided in base region 102. In order to minimize the collector contact resistance highly doped plug 106 (e.g. N+) is provided in epitaxial region 962 to connect buried collector contact region 822 to collector contact metallization 18'. Base region 102 has metallization 14' and emitter region 104 has metallization 16'. Emitter metallization 16' also connects emitter 104 to highly doped (e.g. N+) region 106 provided in epitaxial region 961 above highly doped (e.g.N+) substrate portion 821. N+ region 108 is desirably provided at the same time as collector contact region 106 in connection with transistor 100. Formation of transistor 100 and deep contacts 106, 108 are accomplished using means and methods well known in the art. Metallized contacts to the various device regions are made through openings in surface dielectric layer 101 in the conventional manner.

Figure 13:
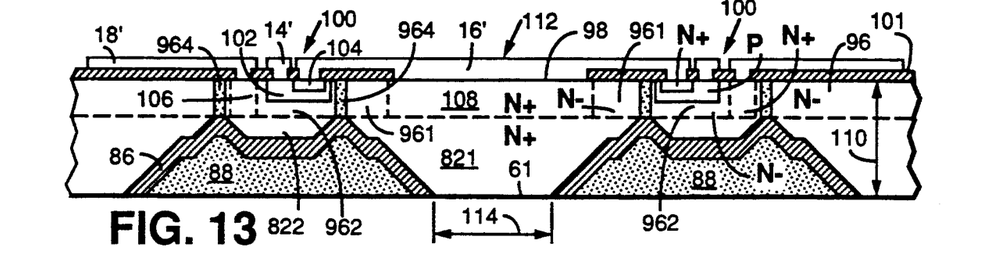
Figure 14:
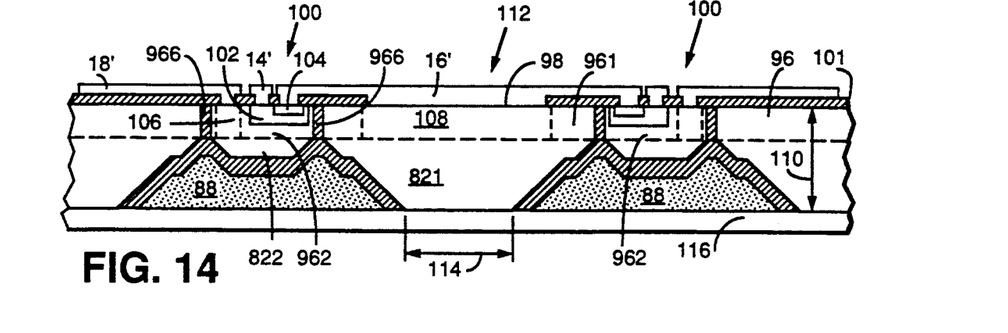

Referring again to FIGS. 12-13, back surface 89 of polyhandle 88 is shaped out until surface 61 of original substrate region 821 is reexposed. This is conveniently accomplished using substantially the same techniques used to shape out surface 65 of substrate 60. The structure shown in FIG. 13 has overall thickness 110 of approximately 100-150 micrometers, typically about 126 micrometers. FIG. 13 illustrates the situation where poly regions 964 are left in place. Because the poly formed during deposition of lightly doped epitaxial layer 96 has very high resistance, it provides electrical isolation between collector region 962 and portion 961 of epitaxial layer 96 on the other side of poly wall 964. While this is particularly convenient and simple from a manufacturing point of view it is not essential. In an alternate embodiment the result of which is illustrated in FIG. 14, poly walls 964 are oxidized to form oxide walls 966. This may be accomplished relatively easily since poly is well know to oxidize more readily than single crystal semiconductor material. It is convenient Prior to convert poly walls 964 to dielectric walls 966 prior to fabricating device regions 102, 104, 106. This may be accomplished by providing, for example, silicon nitride mask 113 on surface 98 of the structure of FIG. 11 having openings which lie approximately over poly walls 964. When exposed to an oxidizing ambient (e.g. steam or high pressure oxygen or a combination thereof), the nitride layer shown by dotted line 113 in FIG. 11 protects the majority of surface 98 while poly regions 964 are converted to dielectric isolation walls 966. Following this poly-oxide conversion step, the structure is then processed in the same manner as previously discussed in connection with FIGS. 11-13.

N+ region 821 of original substrate 60 and N+ region 108 formed in region 961 of epitaxial layer 62 combine to provide a convenient vertical electrical feedthrough extending from upper surface 98 of epi layer 96 to newly exposed surface 61 at the bottom of region 821 in FIGS. 13-14. Metallization layer 16 (see FIG.. 14) may be applied to surface 61 to facilitated electrical contact thereto and mounting of the finished device to a heat-sink and/or ground plane.

FIGS. 13-14, show the situation where emitter 104 is intended to be the common terminal of the structure and is therefore connected by metallization lead 16' to N+ regions 108, 821. Those of skill in the art will appreciate based on the description herein that through connection 112 provided by the combination of highly doped (e.g.N+) region 108 and highly doped (e.g.N+) substrate portion 821 could be connected to any device region or to any input/output or common lead of an integrated circuit formed by the method of the present invention.

Figure 5:
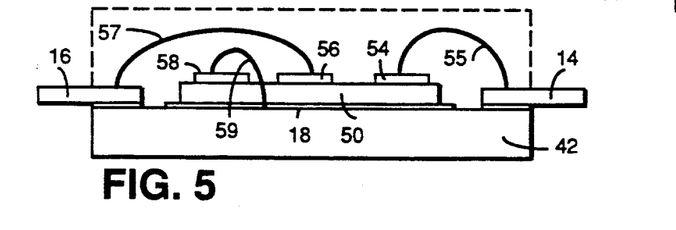

Because the lateral dimension 114 (e.g. about 50-500 micrometers) of feedthrough 112 may be made equal to or larger than thickness 110 (e.g. about 125 micrometers) of feedthrough 112, the electrical impedance of feedthrough 112 may be made small in comparison to the electrical impedance represented, by for example, wire bond 57 in FIG. 5. As a consequence, the structure of FIGS. 13-14 is electrically equivalent to schematic 30 shown in FIG. 2 in which parasitic impedance 17 between device terminal 16' and package terminal 16 has been substantially eliminated. For example, the inductance of a bonding wire of about 38 micrometers diameter and 750-800 micrometers length is about 0.5 nanohenrys. At one gigahertz this contributes a reactance of about three ohms. However, a single crystal N+ silicon feedthrough of about 76×152 micrometers area and 127 micrometers thickness has an inductance of less than 0.05 nanohenrys and a reactance of less than 0.3 ohm. Thus, the invented arrangement can provide a very substantial reduction in ground lead impedance. This substantially extend the high frequency performance because the degenerative effect of common mode parasitic impedance 17 (FIGS. 1A-1B) has been substantially eliminated.

Figure 15:
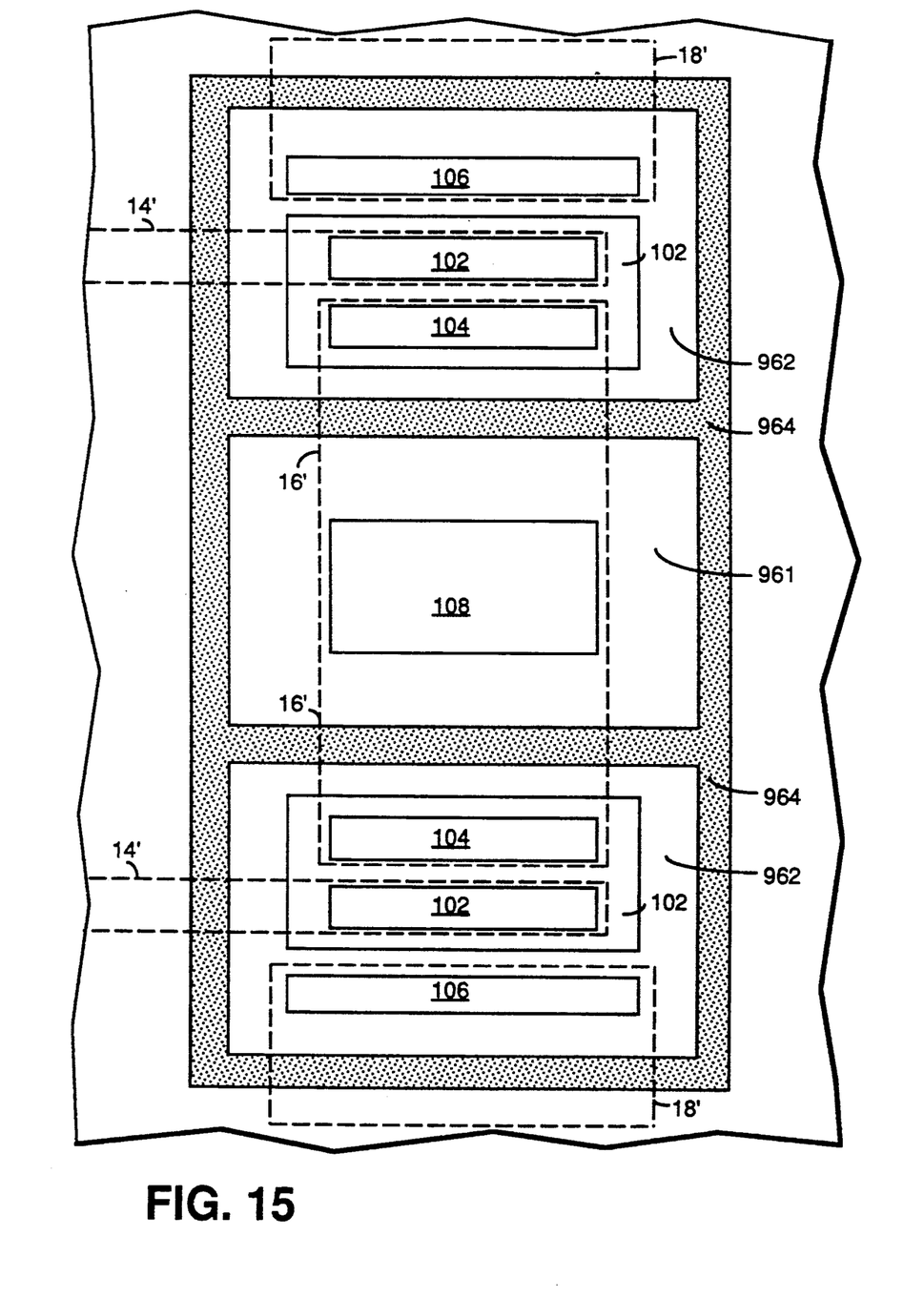
FIG. 15 is a simplified top view of the device structure shown in FIG. 13.

FIG. 15 is a simplified top view of the structure of FIGS. 13-14 in which the same reference numerals have been used to identify the regions in FIG. 15 equivalent to those in FIGS. 13-14. In order not to obscure underlying features, the metallized regions are shown as dashed lines and surface dielectric 101 of FIGS. 12-14 is transparent. It will be observed that each transistor 100 and feedthrough or ground via 112 are located within a circumferential polysilicon or oxide wall 964, 966. This provides a particularly compact structure with low parasitic capacitance and inductance.

Having described the invention, those of skill in the art will appreciate that various modifications may be made in the choice of semiconductor materials, in the choice of conductivity types and in the choice of devices which are fabricated within portions 821, 822 of substrate 60 or portions 961 or 962 of epitaxial layer 96. It will be further appreciated that ground via 112 need not be limited to a particular region of the device but may be provided at various locations and, if desired, extend over a substantial area to further reduce impedances.

While particular conductivities, and conductivity types, choices of materials and sequences of steps have been shown and described, those of skill in the art will understand that other materials, conductivity types and devices may also be used. For example and not intended to be limiting, bipolar transistor 100 may be replaced by a MOSFET, SCR, resistor, MOSCAP, diode, or MESFET or combination thereof.

Accordingly it is intended to include these and such other variations as will occur to those of skill in the art based upon the description herein in the claims that follow.

What is claimed is:

1. A method for providing a dielectrically isolated semiconductor device, comprising:
providing a single crystal semiconductor substrate having first and second principal surfaces;
forming in either order, a first cavity adjacent a first portion of the first surface and extending into the substrate a predetermined first distance from the first surface, and a second cavity at least partly within the first cavity extending into the substrate a predetermined second distance from a bottom portion of the first cavity;
forming an insulated support having a first surface in contact with the first portion of the first surface of the substrate and with exposed surfaces of the first and second cavities and having an opposed second surface;
removing material from the second surface of the substrate until part of the insulated support and a further part of the substrate are exposed;
forming an epitaxial layer on the further part of the substrate which is lightly doped compared to the substrate and of the same conductivity type;
forming a highly doped region in a first portion of the epitaxial layer in contact with a first portion of the substrate adjacent the first portion of the substrate surface; and
removing part of the insulating support to expose the first portion of the first surface of the substrate.

2. The method of claim 1 further comprising forming a device region in a second portion of the epitaxial layer in contact with a second portion of the substrate forming a bottom of the first cavity.

3. A method for forming a semiconductor device, comprising:
forming a first cavity in a single crystal substrate, the single crystal substrate having a first surface and a second surface, and the first cavity extending into the single crystal substrate from the first surface;

forming a second cavity in the first cavity wherein the second cavity extends further into the single crystal substrate than the first cavity;

providing an insulating layer on the first surface of the single crystal substrate and in the first and second cavities;

removing a portion of the single crystal substrate beginning at its second surface and extending toward the first surface to reach the second cavity to provide a first single crystal area bounded by the second cavity and a second single crystal area outside the first cavity area;

providing a semiconductor device in the first single crystal area and coupling a current carrying electrode of the semiconductor device to the second single crystal area; and removing a portion of the insulating layer to create a backside that exposes the second crystal are so contact can be made to the current carrying electrode through the second single crystal area exposed on the backside.

4. The method of claim 3 wherein providing a semiconductor device includes forming a bipolar transistor having an emitter wherein the emitter serves as the current carrying electrode.

* * * * *

UNITED STATES PATENT AND TRADEMARK OFFICE
CERTIFICATE OF CORRECTION

PATENT NO. : 5,145,795

DATED : September 8, 1992

INVENTOR(S) : Paul W. Sanders et al.

It is certified that error appears in the above-identified patent and that said Letters Patent is hereby corrected as shown below:

Column 10, claim 3, line 6, change "are" to --area--.

Signed and Sealed this

Fourteenth Day of June, 1994

Attest:

BRUCE LEHMAN

Attesting Officer

Commissioner of Patents and Trademarks